United States Patent
Schwarzl

(10) Patent No.: US 6,577,526 B1
(45) Date of Patent: Jun. 10, 2003

(54) MAGNETORESISTIVE ELEMENT AND THE USE THEREOF AS STORAGE ELEMENT IN A STORAGE CELL ARRAY

(75) Inventor: Siegfried Schwarzl, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/806,617

(22) PCT Filed: Aug. 2, 1999

(86) PCT No.: PCT/DE99/02387

§ 371 (c)(1),
(2), (4) Date: Mar. 30, 2001

(87) PCT Pub. No.: WO00/10178

PCT Pub. Date: Feb. 24, 2000

(30) Foreign Application Priority Data

Aug. 12, 1998 (DE) .......................................... 198 36 568

(51) Int. Cl.$^7$ ............................................... G11C 11/00
(52) U.S. Cl. ....................................... 365/158; 365/171
(58) Field of Search ............................... 365/158, 171, 365/173, 157

(56) References Cited

U.S. PATENT DOCUMENTS

| | | | |
|---|---|---|---|
| 5,012,444 A | * | 4/1991 | Hurst, Jr. et al. ............ 365/173 |
| 5,477,482 A | | 12/1995 | Prinz |
| 5,541,868 A | | 7/1996 | Prinz |
| 5,867,025 A | * | 2/1999 | Allenspach et al. ........ 324/252 |
| 6,111,784 A | * | 8/2000 | Nishimura ................ 365/173 |

OTHER PUBLICATIONS

"High Density Nonvolatile Magnetoresistive RAM" (Tehrani et al.), IEDM 96–193, pp. 7.7.1–7.7.4.
"An IC Process Compatible Nonvolatile Magnetic RAM" (Tang et al.), IEDM, 95–997, pp. 5.7.1–5.7.2.
"Magnetic Tunneling Applied to Memory (invited)" (Daughton), ISSN, vol. 81, No. 8, 1997, pp. 3758–3763.

* cited by examiner

Primary Examiner—Vu A. Le
(74) Attorney, Agent, or Firm—Laurence A. Greenberg; Werner H. Stemer; Gregory L. Mayback

(57) ABSTRACT

The magnetoresistive element has a first ferromagnetic element, a nonmagnetic layer element, and a second ferromagnetic layer element arranged in such a way that the nonmagnetic layer element is disposed between the first ferromagnetic layer element and the second ferromagnetic layer element. The first ferromagnetic layer element and the second ferromagnetic layer element are formed of substantially the same material, but they differ in their extent parallel to the interface to the nonmagnetic layer element in that they have different measurements in at least one dimension. The magnetoresistive element is suitable both as a sensor element and as a memory element in a memory cell configuration.

13 Claims, 3 Drawing Sheets

MAGNETORESISTIVE ELEMENT AND THE USE THEREOF AS STORAGE ELEMENT IN A STORAGE CELL ARRAY

CROSS-REFERENCE TO RELATED APPLICATION

This application is a 371 of International Application No. PCT/DE99/02387, filed Aug. 2, 1999, which designated the United States.

BACKGROUND OF THE INVENTION

FIELD OF THE INVENTION

Magnetoresistive elements are increasingly used as sensor elements or as memory elements for memory cell configurations, so-called MRAMs (see S. Mengel, "Technologieanalyse Magnetismus Band 2, XMR-Technologien", published by VDI Technologiezentrum Physikalische Technologien, August 1997). In the art, the term "magnetoresistive element" refers to a structure which comprises at least two ferromagnetic layers and a nonmagnetic layer disposed in between these. Depending on the design of the layer structure, a distinction is made between GMR element, TMR element, and CMR element.

The term "GMR element" is used in the art for layer structures which comprise at least two ferromagnetic layers and a nonmagnetic, conductive layer disposed between these and which exhibit the so-called GMR (giant magnetoresistance) effect. The GMR effect refers to the fact that the electrical resistance of the GMR element depends on whether the magnetizations in the two ferromagnetic layers are oriented parallel or antiparallel. The GMR effect is large compared with the so-called AMR (anisotropic magnetoresistance) effect. The AMR effect refers to the fact that the resistance in magnetized conductors parallel and perpendicular to the direction of magnetization differs. The AMR effect is a bulk effect which occurs in ferromagnetic single layers.

The term "TMR element" is used in the art for tunneling magnetoresistance structures which comprise at least two ferromagnetic layers and an insulating, nonmagnetic layer disposed between these. The insulating layer is so thin as to give rise to a tunneling current between the two ferromagnetic layers. These layer structures likewise exhibit a magnetoresistive effect which is caused by a spin-polarized tunneling current through the insulating, nonmagnetic layer disposed between the two ferromagnetic layers. In this case, too, the electrical resistance of the TMR element depends on whether the magnetizations in the two ferromagnetic layers are oriented parallel or antiparallel. The relative change in resistance here is from about 6 percent to about 30 percent.

The term "CMR effect" describes a further magnetoresistive effect. Because of its measurement (relative change in resistance by from 100 to 400 percent at room temperature) it is referred to as colossal magnetoresistance (CMR) effect. It requires a high magnetic field, because of the high coercitivities it involves, to switch between the magnetization states.

U.S. Pat. No. 5,477,482 proposed an annular configuration of the ferromagnetic layers and the nonmagnetic layer of a CMR element, the rings being stacked on top of one another or being nested concentrically.

It has been proposed (see for example S. Tehrani et al., IEDM 96-193 and D. D. Tang et al., IEDM 95-997) to use GMR elements or TMR elements as memory elements in a memory cell configuration. The memory elements are connected in series via read lines. Running transversely to these are word lines which are insulated both with respect to the read lines and with respect to the memory elements. Signals applied to the word lines give rise to a magnetic field which is a consequence of the current flowing within the word line and which, if sufficiently strong, affects the memory elements located underneath. The memory cell configuration exploits the fact that the resistance of the memory elements differs, depending on whether the magnetizations in the two ferromagnetic layers are oriented parallel or antiparallel to one another. To write information, the direction of magnetization of the one ferromagnetic layer is therefore pinned, while that of the other ferromagnetic layer is switched. To this end, crossing lines, which are also referred to as xy lines and which cross at the memory cell to be written to, are fed with signals in such a way that a magnetic field sufficient for remagnetization is produced at the crossing point.

Pinning the direction of magnetization in the one ferromagnetic layer is achieved by an adjacent antiferromagnetic layer which pins the magnetization (see D. D. Tang et al., IEDM 95-997) or by differing layer thicknesses of the ferromagnetic layers (see S. Tehrani et al., IEDM 95-193). Here, the antiferromagnetic layer differs in material composition from the adjacent ferromagnetic layer whose magnetization state is pinned.

As a result of the different layer thicknesses of the two ferromagnetic layers, a higher magnetic field is required in the one ferromagnetic layer to affect the direction of magnetization than in the other one. To write information, the magnetic field is assigned such a level that it is able to affect only the direction of magnetization in the one of the two ferromagnetic layers. The direction of magnetization in the other ferromagnetic layer, which can only be switched over by means of an increased magnetic field, therefore remains unaffected thereby.

As the layer thickness of the ferromagnetic layer cannot, on the one hand, drop below a minimum layer thickness of about 5 nm owing to fabrication constraints, and on the other hand the maximum layer thickness of the ferroelectric layer in a GMR or TMR element is also limited—by the fact that a defined direction of magnetization parallel to the layer plane must be present—it is necessary in this case for the switching magnetic field to be set precisely.

SUMMARY OF THE INVENTION

The object of the present invention is to provide a magnetoresistive element which overcomes the above-noted deficiencies and disadvantages of the prior art devices and methods of this general kind, and which can be fabricated in good yields within the context of semiconductor process technology and which is insensitive in terms of setting the switching magnetic field.

With the above and other objects in view there is provided, in accordance with the invention, which can be used advantageously, inter alia, as a memory element in a memory cell configuration or as a sensor element.

In a first embodiment, the magnetoresistive element comprises the following features:
a plurality of planar layer elements, including a first ferromagnetic layer element, a nonmagnetic layer element on the first ferromagnetic layer element and forming an interface therewith, and a second ferromagnetic layer element on the nonmagnetic layer element and forming an interface therewith, the planar layer elements defining a stack with a layer sequence;

the first ferromagnetic layer element and the second ferromagnetic layer element comprising essentially the same material and having respective measurements in a dimension perpendicular to the layer sequence differing by at least percent relative to one another, and preferably by 30%.

In other words, the magnetoresistive element comprises a first ferromagnetic layer element, a nonmagnetic layer element, and a second ferromagnetic layer element which are arranged in such a way that the nonmagnetic layer element is disposed between the first ferromagnetic layer element and the second ferromagnetic layer element. In this arrangement, the nonmagnetic layer element has one interface each both with the first ferromagnetic layer element and with the second ferromagnetic layer element. The first ferromagnetic layer element and the second ferromagnetic layer element comprise essentially the same material. The first ferromagnetic layer element and the second ferromagnetic layer element have different measurements in at least one dimension parallel to the interface with the nonmagnetic layer element.

As a result of this different shape of the first ferromagnetic layer element and the second ferromagnetic layer element, the magnetic fields required to switch over the directions of magnetization in the ferromagnetic layer elements differ. This effect is referred to as shape anisotropy. Since in each layer element the measurements perpendicular to the layer thickness are distinctly larger than the layer thickness, larger differences in this measurement are possible in the present magnetoresistive element than is possible regarding the layer thickness in the element proposed in S. Tehrani et al., IEDM 96-193. These larger differences in measurement result in distinctly different magnetic field strengths required to switch over the direction of magnetization in the respective layer. Thus the magnetoresistive element is less sensitive with respect to the precise setting of the switching magnetic field.

As the first ferromagnetic layer element and the second ferromagnetic layer element consist of essentially the same material, the magnetoresistive element can be fabricated using semiconductor process technology, especially silicon process technology with the thermal loads of about 450° C. occurring there. In this temperature range, diffusion is to be expected, given the diffusion mobility of elements present in magnetoresistive layer systems, especially Fe, Co, Ni, Cu etc., the diffusion modifying the characteristics of the ferromagnetic layer elements. The feared diffusion results in a change in the material composition in the interface zones, which adversely affects the spin-dependent electron transport on which the magnetoresistive effects in these elements are based. Even minor diffusion-caused migrations of material over a distance in the range from 1 to 5 nm beyond these interfaces are therefore expected to lead to considerable changes in the magnetic and electrical characteristics. The use of an antiferromagnetic layer to pin the direction of magnetization in one of the ferromagnetic layers therefore likewise appears to be problematic, since the antiferromagnetic layer must differ, in terms of material composition, from the ferromagnetic layer, and these diffusion processes between the adjacent layers are expected to result in a change in the material composition.

This problem is overcome in the magnetoresistive element according to the invention in that the two ferromagnetic layer elements consist of essentially the same material, so that no concentration gradient arises between the two ferromagnetic layer elements. The absence of a concentration gradient between the two ferromagnetic layer elements causes the driving force for a diffusion-caused material transport beyond the nonmagnetic layer element to disappear.

Parallel to the interface with the nonmagnetic layer element, the ferromagnetic layer elements can have any cross section.

In the first embodiment of the invention, the first ferromagnetic layer element, the nonmagnetic layer element and the second ferromagnetic layer element are configured as planar layer elements which are joined together to form a layer stack. In this case, the measurements of the first ferromagnetic layer element and of the second ferromagnetic layer element differ in at least one dimension which is perpendicular to the direction of the layer sequence. At the same time, it is within the scope of the invention for the first ferromagnetic layer and the second ferromagnetic layer to have essentially identical measurements in a dimension perpendicular to the layer sequence.

In accordance with an added feature of the invention, the thicknesses of the ferromagnetic layer elements are between 2 nm and 20 nm. Perpendicular to the layer thickness, the measurement of the first ferromagnetic layer element is from 50 nm×80 nm to 250 nm×400 nm and that of the second layer element from 65 nm×80 nm to 350 nm×400 nm, a difference of from at least 20 percent to 30 percent existing in one dimension. The cross section of the first ferromagnetic layer element and of the second ferromagnetic layer element here is preferably essentially rectangular. Alternatively, however, it can be round, oval or polygonal.

There is also provided, in a further embodiment of the invention, a magnetoresistive element, comprising:

a plurality of layer elements having a hollow cylindrical shape with a principal cylinder axis, the layer elements including a first ferromagnetic layer element, a nonmagnetic layer element on the first ferromagnetic layer element and forming an interface therewith, and a second ferromagnetic layer element on the nonmagnetic layer element and forming an interface therewith;

the first ferromagnetic layer element and the second ferromagnetic layer element comprising substantially the same material; and each of the layer elements having a respective inner diameter and a respective outer diameter, wherein one of the inner and outer diameters of the first ferromagnetic layer element differs from a respective inner or outer diameter of the second ferromagnetic layer element, and wherein the first ferromagnetic layer element, the nonmagnetic layer element, and the second ferromagnetic layer element are stacked in a direction of the principal axes of the hollow cylinders.

In other words, the first ferromagnetic layer element, the nonmagnetic layer element, and the second ferromagnetic layer element are each of annular shape, the ring widths of the first ferromagnetic layer element and of the second ferromagnetic layer element differing from one another. The first ferromagnetic layer element, the nonmagnetic layer element and the second ferromagnetic layer element have the shape of a hollow cylinder and are stacked in the direction of the principal axes of the hollow cylinders. The shape anisotropy of the magnetic switching field is implemented in this embodiment by the differing ring widths, i.e. half the difference of outer diameter and inner diameter of each hollow cylinder, of the first ferromagnetic layer element and of the second ferromagnetic layer element. The thicknesses of the first ferromagnetic layer element and of the second ferromagnetic layer element are each from 2 nm to 20 nm. The outer diameter of the first ferromagnetic layer element and of the second ferromagnetic layer element are in the range of between 50 nm and 400 nm, the outer diameters and/or inner diameters of the first ferromagnetic layer element and the second ferromagnetic layer element differing by from 20 percent to 50 percent. In one embodiment, the outer diameter of the first ferromagnetic layer element is from 75 nm to 300 nm and the outer diameter of the second ferromagnetic layer element is from 100 nm to 400 nm.

In accordance with an additional feature of the invention,
   the first ferromagnetic layer element and the second ferromagnetic layer element each has a thickness of between 2 nm and 20 nm and the outer diameters of the first ferromagnetic layer element and the second ferromagnetic layer element are in a range from 50 to 400 nm; and
   at least one of the outer diameters and the inner diameters of the first ferromagnetic layer element and the second ferromagnetic layer element differ from 20 percent to 50 percent.

In accordance with another feature of the invention,
   the outer diameter of the first ferromagnetic layer element is from 75 nm to 300 nm and a thickness of the first ferromagnetic layer element parallel to the principal axis is from 2 nm to 20 nm; and
   the outer diameter of the second ferromagnetic layer element is from 100 nm to 400 nm and a thickness of the second ferromagnetic layer element parallel to the principal axis of the cylinder is from 2 nm to 20 nm.

With the above and other objects in view there is also provided, in yet a further embodiment of the invention, a magnetoresistive element, comprising:
   a plurality of layer elements each having a hollow cylindrical shape and being disposed concentrically with one another along a principal cylinder axis, the layer elements including a first ferromagnetic layer element, a nonmagnetic layer element on the first ferromagnetic layer element and forming an interface therewith, and a second ferromagnetic layer element on the nonmagnetic layer element and forming an interface therewith;
   the first ferromagnetic layer element and the second ferromagnetic layer element comprising substantially the same material;
   the nonmagnetic layer element being disposed, in a radial direction with respect to the hollow cylindrical shapes, between the first ferromagnetic layer element and the second ferromagnetic layer element; and
   the first ferromagnetic layer element having a height in a direction parallel to the principal axis of the cylindrical shapes different from a height of the second ferromagnetic layer element.

In this third embodiment of the invention, the first ferromagnetic layer element, the nonmagnetic layer element and the second ferromagnetic layer element are each in the form of a hollow cylinder and are arranged concentrically relative to one another, the nonmagnetic layer element being disposed between the first ferromagnetic layer element and the second ferromagnetic layer element. The first ferromagnetic layer element and the second ferromagnetic layer element in this case differ in terms of their height parallel to the cylinder axis.

The height of the first ferromagnetic layer element is preferably between 50 nm and 250 nm, the height of the second ferromagnetic layer element is between 80 nm and 400 nm, the difference in height being between 30 nm and 150 nm and usefully being at least from 20 to 30 percent. In another embodiment, the first ferromagnetic layer element has an outer diameter of between 70 nm and 400 nm, an inner diameter of between 60 nm and 390 nm and a height, parallel to the principal axis of the cylinder, of between 35 nm and 180 nm, and the second ferromagnetic layer element ha s an outer diameter of between 60 nm and 390 nm, an inner diameter of between 50 nm and 380 nm and a height, parallel to the principal axis of the cylinder, of between 50 nm and 400 nm.

Preferably, the ferromagnetic layer elements each comprise at least one of the elements Fe, Ni, Co, Cr, Mn, Gd, Dy. The nonmagnetic layer element can be either conductive or nonconductive. Preferably, the nonmagnetic layer element provided is nonconductive and includes at least one of the materials $Al_2O_3$, NiO, $HfO_2$, $TiO_2$, NbO and/or $SiO_2$ and has a measurement, perpendicular to the interface with the ferromagnetic layer elements, in the range of between 1 and 4 nm. In this case, the magnetoresistive element is a TMR element which, compared with a GMR element, has a high electrical resistance perpendicular to the tunneling layer.

Alternatively, the nonmagnetic layer element can be implemented in a conductive material, e.g. Cu, Au or Ag, and have a measurement, perpendicular to the interface with the ferromagnetic layer elements, of from 2 nm to 4 nm.

Other features which are considered as characteristic for the invention are set forth in the appended claims.

Although the invention is illustrated and described herein as embodied in a magnetoresistive element and use thereof as a memory element in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a section taken along the line I—I in FIG. 1a;

FIG. 2b is a section taking along the line II—II in FIG. 2a;

FIG. 3b is a section taking along the line III—III in FIG. 3a;

FIG. 4b is a section taking along the line IV—IV in FIG. 4a; and

DESCRIPTION OF THE PREFERRED EMBODIMENTS

Figure 1A:
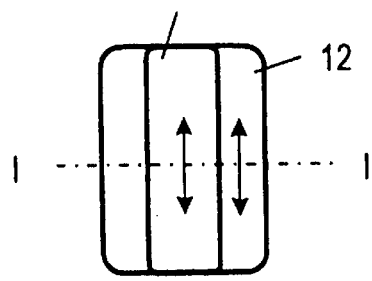
FIG. 1a is a top plan view onto a magnetoresistive element comprising planar layer elements, in which the measurements of a first ferromagnetic element and of a second ferromagnetic element perpendicular to the directions of magnetization differ from one another.
Figure 1B:
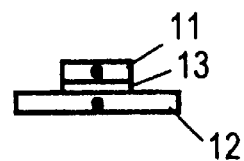

Referring now to the figures of the drawing in detail and first, particularly, to FIGS. 1a and 1b thereof, there is seen a first ferromagnetic layer element 11, a nonmagnetic layer element 13, and a second ferromagnetic layer element 12. The elements are arranged on top of one another as a stack. The first ferromagnetic layer element 11 is of essentially rectangular shape with measurements of 130 nm×250 nm. In the direction of the layer sequence (vertical in FIG. 1b), the first ferromagnetic layer element 11 has a thickness of 10 nm. The nonmagnetic layer element 13 likewise has an essentially rectangular cross section with measurements of 130 nm×250 nm. In the direction of the layer sequence it has a thickness of 2 nm. The second ferromagnetic layer element 12 has an essentially rectangular cross section with measurements of 200 nm×250 nm. In the direction of the layer sequence it has a thickness of 10 nm.

The first ferromagnetic layer element 11 and the nonmagnetic layer element 13 have the same length as the second ferromagnetic layer element 12, but a smaller width than the second ferromagnetic layer element 12. The first ferromagnetic layer element 11 and the nonmagnetic layer element 13 are centered, with respect to their width, on the second ferromagnetic layer element 12. Both in the first ferromagnetic layer element 11 and in the second ferromagnetic layer element 12 there exist preferred directions of magnetization parallel to the length of the respective layer element 11, 12. The directions of magnetization are shown as double-headed arrows in FIG. 1a.

The first ferromagnetic layer element 11 and the second ferromagnetic layer element 12 have the same material composition. They consist of Co. The nonmagnetic layer element 13 consists of $Al_2O_3$.

The first ferromagnetic layer element 11 has a higher switching threshold than the second ferromagnetic layer element.

Figure 2A:
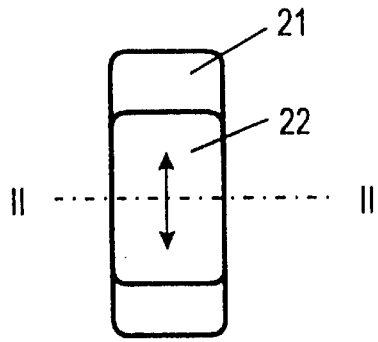
FIG. 2a is a top plan view onto a magnetoresistive element comprising planar layer elements, in which the measurements of a first ferromagnetic layer element and of a second ferromagnetic layer element parallel to the directions of magnetization differ from one another.
Figure 2B:
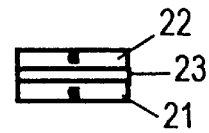

Referring now to FIGS. 2a and 2b in this second exemplary embodiment, the first ferromagnetic layer element 21 made of Co, a nonmagnetic layer element 23 made of $Al_2O_3$, and a second ferromagnetic layer element 22 made of Co are arranged on top of one another. The first ferromagnetic layer element 21 is of essentially rectangular shape with a length of 250 nm, a width of 130 nm and a thickness, in the direction of the layer sequence, of 10 nm. The second ferromagnetic layer element 22 likewise has an essentially rectangular cross section with a length of 200 nm, a width of 130 nm and a thickness, in the direction of the layer sequence, of 10 nm. The nonmagnetic layer element has the same cross section as the second ferromagnetic layer element 22 and has a thickness, parallel to the layer sequence, i.e., the stack direction, of 2 nm.

In the first ferromagnetic layer element 21 and in the second ferromagnetic layer element 22, magnetization states with directions of magnetization parallel to the length of the respective layer element 21, 22 are adopted. The directions of magnetization are shown as a double-headed arrow in FIG. 2a.

The second ferromagnetic layer element 22 and the nonmagnetic layer element 23 are centered, in the length direction, on the first ferromagnetic layer element 21. In this arrangement, the first ferromagnetic layer element has a higher switching threshold than the second ferromagnetic layer element 22.

Figure 3A:
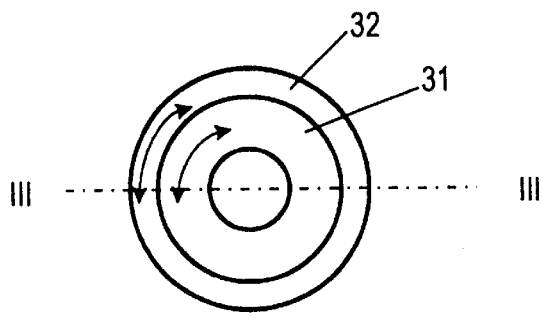
FIG. 3a is a top plan view onto a magnetoresistive element which comprises hollow-cylindrical layer elements which are stacked on top of one another and differ in terms of their outer diameters.
Figure 3B:
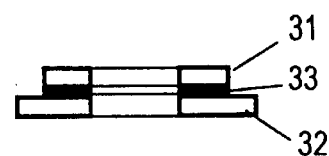

Referring now to FIGS. 3a and 3b, in this third exemplary embodiment the magnetoresistive element comprises a first ferromagnetic layer element 31 made of NiFe, a second ferromagnetic layer element 32 made of NiFe, and a nonmagnetic layer element 33 made of $Al_2O_3$. Each of these elements has a cylindrical footprint. The first ferromagnetic layer element 31, the nonmagnetic layer element 33 and the second ferromagnetic layer element 32 are arranged, in the direction of the principal axes of the hollow cylinders, to form a stack in which the nonmagnetic layer element 33 is disposed between the first ferromagnetic layer 31 and the second ferromagnetic layer element 32 and in which the axes of the cylinders coincide, i.e., the individual elements are stacked coaxially.

The first ferromagnetic layer element 31 and the second ferromagnetic layer element 32 each have a thickness, parallel to the principal axis, of 10 nm. In the first ferromagnetic layer element 31 and the second ferromagnetic layer element 32, annular magnetization states establish themselves which can be of clockwise or counterclockwise orientation.

The nonmagnetic layer element 33 has a thickness, parallel to the principal axis, of 2 nm. The outer diameter of the first ferromagnetic layer element 31 is 200 nm, the outer diameter of the second ferromagnetic layer element 32 is 250 nm, the inner diameters of all the layer elements are 130 nm.

In this configuration, the first ferromagnetic layer element 31 has a larger switching threshold than the second ferromagnetic layer element 32.

Analogously, the hollow-cylindrical layer elements stacked on top of one another can differ in terms of their inner diameters or inner and outer diameters.

Figure 4A:
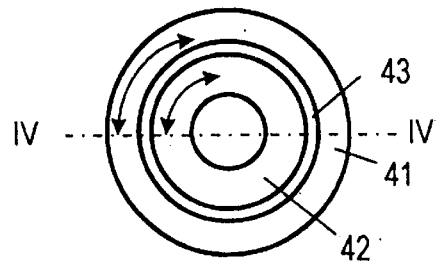
FIG. 4a is a top plan view onto a magnetoresistive element which comprises hollow-cylindrical layer elements which are disposed concentrically relative to one another and which differ in terms of their heights.
Figure 4B:
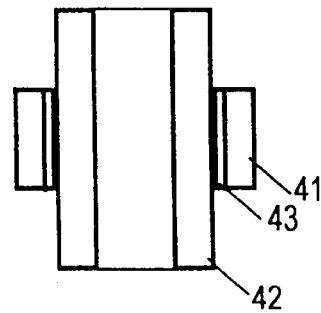

Referring now to FIGS. 4a and 4b, in this fourth exemplary embodiment, a first ferromagnetic layer element 41 made of NiFe, a nonmagnetic layer element 43 made of $Al_2O_3$, and a second ferromagnetic layer element 42 made of NiFe are provided. Each of the elements has the shape of a hollow cylinder and they are disposed concentrically, i.e., coaxially, relative to one another. In this arrangement, the nonmagnetic layer element 43 is disposed between the first ferromagnetic layer element 41 and the second ferromagnetic layer element 42.

The first ferromagnetic layer element 41 has an outer diameter of about 270 nm, an inner diameter of about 260 nm and an a height, parallel to the principal axis of the hollow cylinder, of 180 nm. The nonmagnetic layer element 43 has an outer diameter of about 260 nm, a thickness of 2 nm and a height, parallel to the principal axis of the hollow cylinder, of at least 180 nm. The second ferromagnetic layer element 42 has an outer diameter of about 258 nm, an inner diameter of about 250 nm and a height, parallel to the principal axis of the hollow cylinder, of 250 nm. The first ferromagnetic layer element 41 and the nonmagnetic layer element 43 are centered, in terms of height, on the second ferromagnetic layer element 42.

In the first ferromagnetic layer element 41 and the second ferromagnetic layer element 42, magnetization is annular and can be oriented either clockwise or counterclockwise. The direction of magnetization in each case is shown as a double-headed arrow in FIG. 4a.

In this arrangement, the first ferromagnetic layer element 41 has a higher switching threshold than the second ferromagnetic layer element 42.

Figure 5:
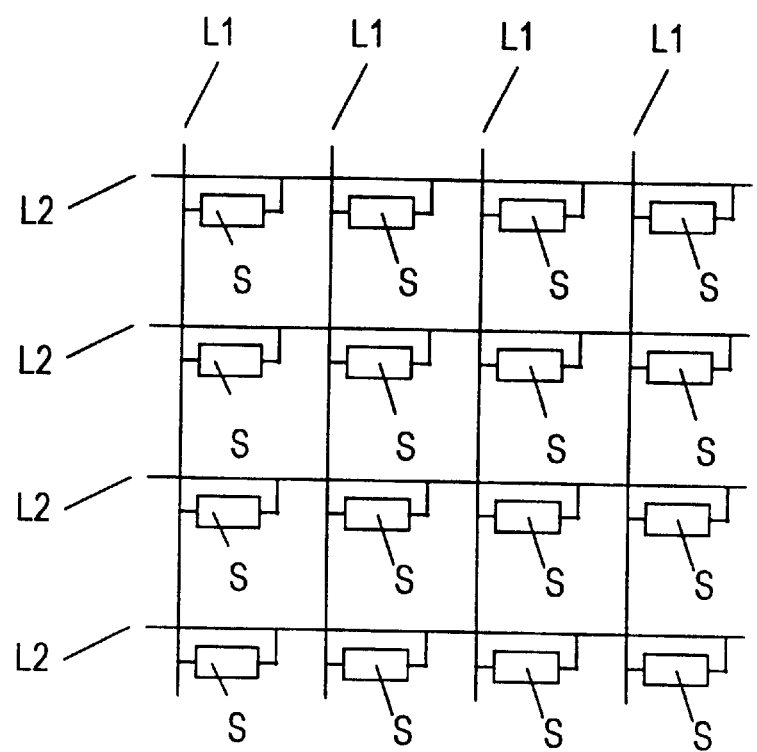
FIG. 5 is a diagram of a detail of a memory cell configuration which comprises magnetoresistive elements as memory elements.

Referring now to FIG. 5, there is shown a memory cell configuration which comprises memory cells S, formed as magnetoresistive elements in accordance with FIGS. 1a to 4b: the memory elements S are arranged in the form of a grid, each memory element S being connected between a first line L1 and a second line L2. The first lines L1 run parallel to one another and cross the second lines L2 which likewise run parallel to one another. To write to a memory element S, such a current is applied to the associated line L1 and the associated second line L2 that the magnetic field produced at the point where the first line L1 and the second line L2 cross one another and where the memory element S is located is sufficiently large to switch the direction of magnetization of the second ferromagnetic layer element. Here, the magnetic field effective at the respective crossing point is a superposition of the magnetic field induced by the current flowing in the first line L1 and of the magnetic field induced by the current flowing in the second line L2.

I claim:

1. A magnetoresistive element, comprising:

a plurality of planar layer elements, including a first ferromagnetic layer element, a nonmagnetic layer element on said first ferromagnetic layer element and forming an interface therewith, and a second ferromagnetic layer element on said nonmagnetic layer element and forming an interface therewith, said planar layer elements defining a stack with a layer sequence;

said first ferromagnetic layer element and said second ferromagnetic layer element comprising essentially the same material and having respective measurements in a dimension perpendicular to said layer sequence differing by at least percent relative to one another, and said first ferromagnetic layer element and said second ferromagnetic layer element further comprising at least one element selected from the group consisting of Cr, Mn, Cd, Dy; and said nonmagnetic layer element comprising at least one material selected from the group consisting of NiO, $HfO_2$, $TiO_2$, NbO, $SiO_2$ and having a thickness in a range between 1 nm and 4 nm.

2. The magnetoresistive element according to claim 1, wherein the measurements of said first ferromagnetic layer element and said second ferromagnetic layer element in the dimension perpendicular to said layer sequence differ by at least 30 percent.

3. The magnetoresistive element according to claim 1, wherein said first ferromagnetic layer element has measurements perpendicular to said layer sequence from 50 nm×80 nm to 250 nm×400 nm and a thickness parallel to said layer sequence between 2 nm and 20 nm; and said second ferromagnetic layer element has measurements perpendicular to said layer sequence from 65 nm×80 nm to 350 nm×400 nm and a thickness parallel to said layer sequence between 2 nm and 20 nm.

4. A magnetoresistive element, comprising:

a plurality of layer elements having a hollow cylindrical shape with a principal cylinder axis, said layer elements including a first ferromagnetic layer element, a nonmagnetic layer element on said first ferromagnetic layer element and forming an interface therewith, and a second ferromagnetic layer element on said nonmagnetic layer element and forming an interface therewith;

said first ferromagnetic layer element and said second ferromagnetic layer element comprising substantially the same material; and each of said layer elements having a respective inner diameter and a respective outer diameter, wherein one of said inner and outer diameters of said first ferromagnetic layer element differs from a respective inner or outer diameter of said second ferromagnetic layer element, and wherein said first ferromagnetic layer element, said nonmagnetic layer element, and said second ferromagnetic layer element are stacked in a direction of the principal axes of said hollow cylinders.

5. The magnetoresistive element according to claim 4, wherein said first ferromagnetic layer element and said second ferromagnetic layer element each has a thickness of between 2 nm and 20 nm and said outer diameters of said first ferromagnetic layer element and said second ferromagnetic layer element are in a range from 50 to 400 nm; and at least one of said outer diameters and said inner diameters of said first ferromagnetic layer element and said second ferromagnetic layer element differ from 20 percent to 50 percent.

6. The magnetoresistive layer element according to claim 4, wherein said outer diameter of said first ferromagnetic layer element is from 75 nm to 300 nm and a thickness of said first ferromagnetic layer element parallel to the principal axis is from 2 nm to 20 nm; and said outer diameter of said second ferromagnetic layer element is from 100 nm to 400 nm and a thickness of said second ferromagnetic layer element parallel to the principal axis of the cylinder is from 2 nm to 20 nm.

7. The magnetoresistive element according to claim 4, wherein said nonmagnetic layer comprises at least one material selected from the group consisting of NiO, $HfO_2$, $TiO_2$, NbO, $SiO_2$ and has a thickness in a range between 1 nm and 4 nm.

8. The magnetoresistive element according to claim 4, wherein said first ferromagnetic layer element and said second ferromagnetic layer element comprise at least one element selected from the group consisting of Cr, Mn, Gd, Dy.

9. A magnetoresistive element, comprising:

a plurality of layer elements each having a hollow cylindrical shape and being disposed concentrically with one another along a principal cylinder axis, said layer elements including a first ferromagnetic layer element, a nonmagnetic layer element on said first ferromagnetic layer element and forming an interface therewith, and a second ferromagnetic layer element on said nonmagnetic layer element and forming an interface therewith;

said first ferromagnetic layer element and said second ferromagnetic layer element comprising substantially the same material;

said nonmagnetic layer element being disposed, in a radial direction with respect to said hollow cylindrical shapes, between said first ferromagnetic layer element and said second ferromagnetic layer element; and said first ferromagnetic layer element having a height in a direction parallel to said principal axis of said cylindrical shapes different from a height of said second ferromagnetic layer element.

10. The magnetoresistive element according to claim 9, wherein the height of said first ferromagnetic layer element is between 50 nm and 250 nm;

the height of said second ferromagnetic layer element is between 80 nm and 400 nm; and a difference in the heights is between 30 nm and 150 nm.

11. The magnetoresistive element according to claim 9, wherein
   said first ferromagnetic layer element has an outer diameter of between 70 nm and 400 nm, an inner diameter of between 60 nm and 390 nm and a height, parallel to the principal axis of the cylinder, of between 35 nm and 180 nm;
   said second ferromagnetic layer element has an outer diameter of between 60 nm and 390 nm, an inner diameter of between 50 nm and 380 nm and a height, parallel to the principal axis of the cylinder, of between 50 nm and 400 nm.

12. The magnetoresistive element according to claim 9, wherein said nonmagnetic layer comprises at least one material selected from the group consisting of NiO, $HfO_2$, $TiO_2$, NbO, $SiO_2$ and has a thickness in a range between 1 nm and 4 nm.

13. The magnetoresistive element according to claim 9, wherein said first ferromagnetic layer element and said second ferromagnetic layer element comprise at least one element selected from the group consisting of Cr, Mn, Gd, Dy.

* * * * *

UNITED STATES PATENT AND TRADEMARK OFFICE
CERTIFICATE OF CORRECTION

PATENT NO.     : 6,577,526 B1
DATED          : June 10, 2003
INVENTOR(S)    : Siegfried Schwarzl It is certified that error appears in the above-identified patent and that said Letters Patent is hereby corrected as shown below:

<u>Column 9,</u>
Line 28, should read as follows:
-- fering by at least 20 percent relative to one another, and --

Signed and Sealed this

Seventh Day of October, 2003

JAMES E. ROGAN
*Director of the United States Patent and Trademark Office*